United States Patent [19]

Cronin

[11] 3,855,553

[45] Dec. 17, 1974

[54] MODULATED TRANSISTOR OSCILLATORS

[75] Inventor: John E. Cronin, Washington, D.C.

[73] Assignee: The United States of America as represented by the Secretary of the Army, Washington, D.C.

[22] Filed: Nov. 3, 1966

[21] Appl. No.: 593,262

[52] U.S. Cl. ............ 331/117 R, 331/107, 332/31 T
[51] Int. Cl. ............ H03b 5/12
[58] Field of Search ........... 307/88.5; 331/109, 107, 331/117 R

[56] References Cited

UNITED STATES PATENTS

| | | | |
|---|---|---|---|
| 2,791,693 | 5/1957 | Moore | 331/109 |
| 2,855,568 | 10/1958 | Lin | 331/109 |

*Primary Examiner*—Maynard R. Wilbur
*Assistant Examiner*—N. Moskowitz
*Attorney, Agent, or Firm*—Saul Elbaum

[57] ABSTRACT

A transistor oscillator wherein output power does not vary with frequency modulation and wherein output frequency does not vary with amplitude modulation. These results are achieved by controlling the phase shift properties of a junction transistor where phase shift properties depend upon the transit time of carriers through the transistor. The transit time is a function of the emitter current and the collector-to-base voltage operating points and the frequency of oscillation of the oscillator circuit depends upon this transit time. Also, the output power of the oscillator is a function of the emitter current and collector-to-base voltage operating points. By simultaneously varying both of these operating points, the frequency of the oscillator can be varied without changing the power output and the output power can be varied without changing the frequency.

3 Claims, 2 Drawing Figures

PATENTED DEC 17 1974 3,855,553

Figure 1:
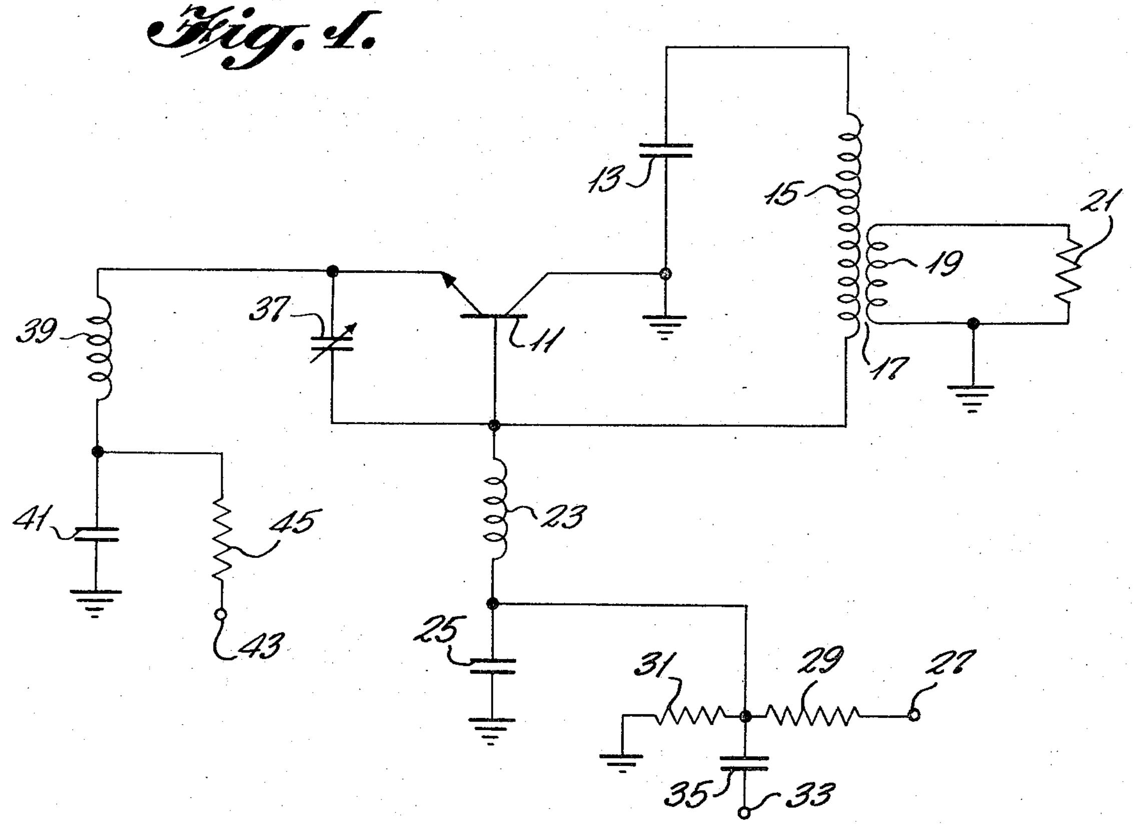

INVENTOR
John E. Cronin

BY Harry M. Saragovitz, Edward J. Kelly, Herbert Berl & J. D. Edgerton
ATTORNEYS

MODULATED TRANSISTOR OSCILLATORS

This invention relates to modulated oscillator circuits and more particularly to transistor oscillator circuits which achieve frequency modulation without amplitude modulation and vice versa.

Conventional frequency modulated oscillators require a separate variable reactance component such as a reactance tube or a voltage variable capacitor to provide the desired frequency modulation. Some transistor oscillators have been designed to provide frequency modulation without separate variable reactance elements by making use of the variation of the collector capacitance of the transistor with collector voltage to provide the desired frequency modulation. These oscillators, however, have generally had the disadvantage of variation in power output with the frequency modulation or, in other words, amplitude modulation as well as frequency modulation. Conversely, amplitude modulated transistor oscillators of the prior art operating at frequencies at which the inherent transistor reactance forms an appreciabale part of the circuit reactance have undesirable frequency variation with the amplitude modulation. Special circuits have been designed to compensate for the power variation in the frequency modulated oscillators and to compensate for the frequency variation in the amplitude modulated oscillators but these special circuits add to the complexity and the cost of the modulated oscillator circuits.

The present invention provides a simple frequency modulated transistor oscillator, the output power of which does not vary with the frequency modulation and provides a simple amplitude modulated transistor oscillator in which the output frequency does not vary with the amplitude modulation. These circuits are achieved by controlling the phase shift properties of a junction transistor, which phase shift properties depend upon the transit time of carriers through the transistor. This transit time is a function of the emitter current and collector-to-base voltage operating points and the frequency of oscillation of the oscillator circuit depends upon this transit time. Also, the output power of the oscillator is a function of the emitter current and collector-to-base voltage operating points. By simultaneously varying both of these operating points, the frequency of the oscillator can be varied without changing the power output and the output power can be varied without changing the frequency.

Accordingly, an object of the present invention is to provide an improved modulated oscillator circuit.

Another object of the present invention is to provide a frequency modulated transistor oscillator in which the output power does not vary with changes in frequency.

A further object of the present invention is to provide an amplitude modulated transistor oscillator the output frequency of which does not vary with the amplitude modulation.

Figure 2:
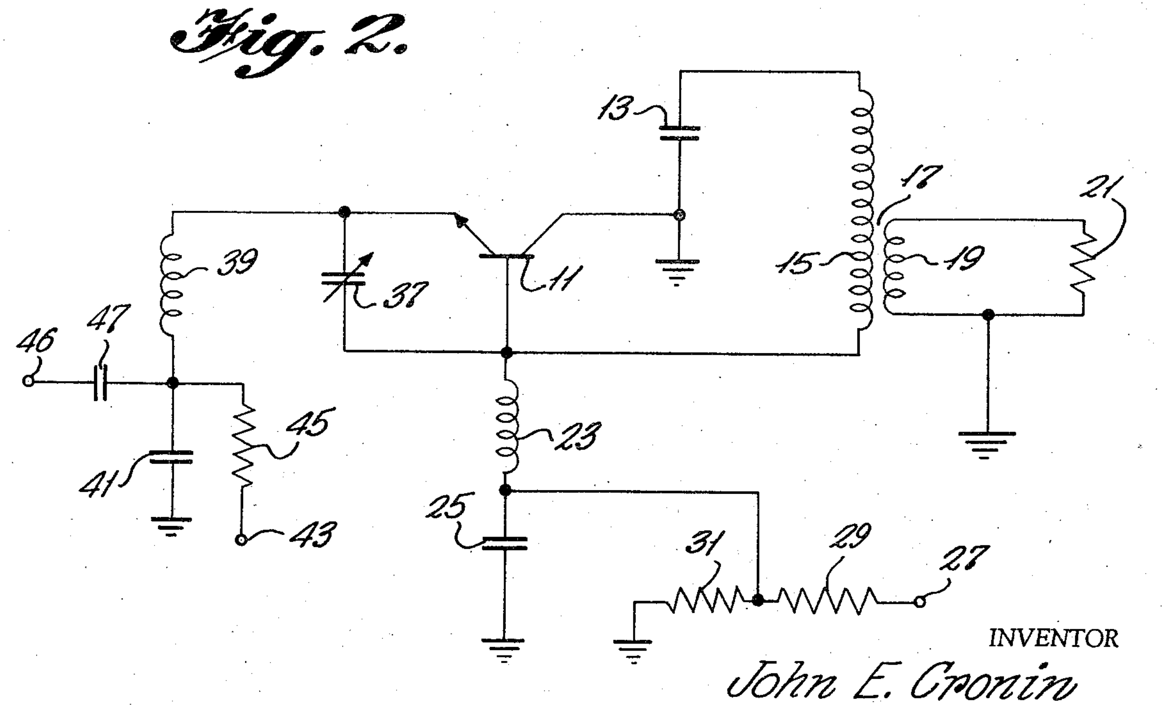

Further objects and advantages of the present invention will become readily apparent as the following detailed description of the present invention unfolds and taken in conjunction with the drawings wherein:

FIG. 1 illustrates the frequency modulated transistor oscillator of the present invention; and FIG. 2 illustrates the amplitude modulated transistor oscillator of the present invention.

In the circuit of FIG. 1, the collector of a NPN junction transistor 11 is connected to ground and is connected through a capacitor 13 and an inductor 15 to the base of the transistor 11. The inductor 15 is a primary winding of a radio frequency transformer 17 having a secondary winding 19, across which is connected the load of the circuit represented by the resistor 21. The values of the capacitor 13 and the inductor 15 are chosen so that the inherent capacitance of the transistor 11 between the base and collector forms an appreciable part of the reactance of the resulting tank circuit comprising this inherent capacitance, the capacitor 13, and the inductor 15 at the resonant frequency of the tank circuit.

The base of the transistor 11 is connected through a radio frequency choke 23 to one side of a capacitor 25, the other side of which is connected to ground. The junction between the choke 23 and the capacitor 25 is connected to a source of negative voltage applied at a terminal 27 through a resistor 29 and is connected to ground through a resistor 31. The modulating input signal is applied to the junction between the resistors 29 and 31 from a terminal 33 through a capacitor 35.

The base of the transistor 11 is connected to the emitter of the transistor 11 through a variable capacitor 37. The emitter of the transistor 11 is connected through a radio frequency choke 39 to one side of a capacitor 41, the other side of which is connected to ground. The junction between the choke 39 and the capacitor 41 is connected through a resistor 45 to a source of negative voltage applied at a terminal 43.

The circuit of FIG. 1 oscillates because of internal feed back in the transistor 11 from the collector to the emitter. The oscillating transistor rectifies the emitter-to-base current which causes the capacitor 25 to charge. The charge on the capacitor 25 biases the transistor 11 so that it operates in a class C mode, in which the transistor conducts for less than 180° of each cycle of oscillation, or in other words for less than one-half of each cycle of oscillation.

The effective transistor reactance from collector-to-base is not merely the collector-to-base capacitance but also includes the effect of a feed back reactance created by the finite transit times of carriers from the emitter to collector. These transit times provide a phase shift, which causes the collector current supplied by the transistor to be out of phase with the tank voltage. The phase of the feed back signal causing the circuit to oscillate is directly dependent upon this phase shift and therefore the frequency of oscillation is directly dependent upon this phase shift. The total transit time delay of carriers in the transistor is made up of the transit time through the emitter, plus the transit time through the base, plus the transit time through the collector. If the sum of the transit times is increased, the resulting phase shift is increased and the frequency of oscillation is decreased. If the sum of the transit times is decreased, the phase shift is decreased and the frequency of oscillation is increased. At high emitter currents, the transit time through the base increases due to the space charge widening of the base region into the collector. Accordingly, when the average emitter current is increased, the sum of the transit times of carriers from the emitter to collector is increased and the frequency of oscillation is decreased. Similarly, a decrease in the average emitter current will cause an increase in the oscillation frequency. An increase in the average emitter current will also cause an increase in the in-phase current flowing in the tank circuit and thus will cause an increase in the power supplied to the tank circuit. Similarly a decrease in the average emitter current will cause a decrease in the power supplied to the tank circuit. Thus, the frequency of oscillation varies inversely with the average emitter current and the output power varies directly with the average emitter current.

An increase in average collector-to-base voltage will cause a decrease in the transit time of carriers through the collector, and thus a decrease in the phase shift between collector current and tank voltage. Thus, an increase in the average collector-to-base voltage will increase the frequency of oscillation. An increase in the average collector-to-base voltage will also result in a higher average oscillator excursion of the collector-to-base voltage from the average value thus causing an increase in the power supplied to the load. Similarly, a decrease in the average collector-to-base voltage will cause a lowering of the oscillator frequency and a lowering of the power supplied to the load. Thus, the frequency of oscillation varies directly with the average collector-to-base voltage and the power output of the circuit varies directly with the average collector-to-base voltage.

If the signal voltage applied between the inductor 23 and the capacitor 25 is changed in the positive direction, the average voltage at the base of the transistor 11 will be changed in a positive direction. This change in average potential will cause an increase in the transistor conduction angle, which is the portion of each cycle of oscillation that the transistor 11 conducts. As a result, the average emitter current will increase. However, the average collector-to-base voltage will decrease. Similarly, if the signal voltage applied to junction between the inductor 23 and the capacitor 25 is changed in a negative direction, the average emitter current will be decreased and the average collector-to-base voltage will be increased. Accordingly, a modulating signal applied to the input 33 when it swings positive will cause the average emitter current to increase and will cause the average collector-to-base voltage to decrease. The increase in the average emitter current as explained above tends to cause a decrease of frequency and an increase in the output power. The decrease in the average collector-to-base voltage as is explained above, likewise tends to cause a decrease in frequency but conversely tends to cause a decrease in the output power. The increase in output power caused by the increase in average emitter current is cancelled out by the decrease in output power caused by the decrease in the average collector-to-base voltage and thus as the modulating signal voltage goes positive, the output power does not change. On the other hand, both the decrease in the average collector-to-base voltage and the increase in the average emitter current will result in a decrease of frequency. Thus, these effects on frequency are additive and the output frequency decreases as the modulating signal voltage swings positive. Similarly, as the modulating signal voltage swings negative, the output frequency increases whereas the output power stays constant. Thus, frequency modulation is achieved in the circuit of FIG. 1 without any variation in output power.

The resistor 45 serves to apply a feed back voltage to the emitter of the transistor 11 proportional to the average emitter current. The value of the resistor 45 determines the ratio of the change in average emitter current to the change in average collector-to-base voltage with a change in the signal voltage applied to the junction between the inductor 23 and the capacitor 25. By a proper choice of this resistor, the changes in the power output due to a change in average emitter current and a change in average collector-to-base voltage can be made to cancel out so that the output frequency of the oscillator will vary with the applied modulating signal voltage without variation in the power output.

The circuit of FIG. 2 is an oscillator which provides amplitude modulation without frequency variation. The circuit of FIG. 2 is similar to that of FIG. 1 and the corresponding parts of the circuit of FIG. 2 have been given the same reference numbers. In the circuit of FIG. 2, the modulating signal, instead of being applied to the junction between the resistors 29 and 31, is applied from a terminal 46 through a capacitor 47 to the junction between the resistor 45 and the inductor 39. The average emitter current flowing through the transistor 11 will vary with the signal voltage applied to the emitter and hence will vary with the signal voltage applied to the junction between the inductor 39 and the resistor 45. When this signal voltage changes in a negative direction, the average emitter current will increase, and when this signal changes in the positive direction, the average emitter current will decrease. As the emitter current increases, the portion of each cycle that the transistor 11 conducts increases resulting in a greater charge being accumulated by the capacitor 25. In other word, the voltage at the junction between the inductor 23 and the capacitor 25 becomes more negative. As a result, the average collector-to-base voltage of the transistor 11 is increased. Thus, it will be seen when the signal voltage applied between the inductor 39 and the capacitor 41 changes in a negative direction, the average emitter current increases and the average collector-to-base voltage increases. In a similar manner, it will be seen that the signal voltage applied to this junction changes in a positive direction, the average emitter current decreases and the average collector-to-base voltage decreases. As was pointed out above, the frequency of oscillation of this circuit varies inversely with changes in average emitter current and varies directly with changes in average collector-to-base voltage, whereas the power output varies directly with average emitter current and varies directly with average collector-to-base voltage. Accordingly, changes in the oscillator frequency due both to changes in the average collector-to-base voltage and to changes in the average emitter current resulting from a change in the signal voltage applied to the junction between the capacitor 41 and the inductor 39 cancel each other out, whereas changes in the power output of the circuit are additive. Accordingly, a modulating signal applied to the junction between the capacitor 41 and the inductor 39 from the input 46 will modulate the amplitude of the output signal voltage produced across the load 21 without varying the output signal frequency.

Thus, the present invention provides relatively simple oscillator circuits, one of which provides frequency modulated oscillation without variation in the output power and the other one of which provides amplitude modulation without variation in the output frequency.

The above description is a preferred embodiment of the present invention and many modifications may be made thereto without departing from the spirit and scope of the invention which is defined in the appended claims.

What is claimed is:

1. A modulated transistor oscillator comprising a junction transistor having a base, collector and emitter means connected to said transistor for biasing said transistor in a Class C mode, at a frequency such that the transistor reactance forms an appreciable part of the reactance of said biasing means, with the angle of conduction of said transistor in each cycle of oscillation being less than 180°, said biasing means comprising a first inductor and first capacitor serially connected between the base terminal of the junction transistor and ground, a resonant tank circuit including a second capacitance and second inductance serially connected between the collector and base of said transistor, said second capacitance and second inductance having values such that the inherent capacitance between the collector and base of said transistor forms an appreciable part of the reactance of the resonant tank circuit means; and means to apply a modulating signal to said transistor to simultaneously vary the average emitter current of said transistor and the average collector-to-base voltage of said transistor.

2. A modulated transistor oscillator as recited in claim 1 wherein said modulating signal is applied to the base of said transistor and a resistor is connected to said emitter to vary the average potential applied to said emitter with said average emitter current.

3. A modulated transistor oscillator as recited in claim 1 wherein said modulating signal is applied to the emitter of said transistor and said first capacitor charges up to a value depending upon said angle of conduction of said transistor in its class C mode of oscillation to thereby vary the average collector-to-base voltage of said transistor with variations in said modulating signal.

* * * * *